United States Patent
Mori et al.

(10) Patent No.: US 8,440,263 B2
(45) Date of Patent: May 14, 2013

(54) FORMING METHOD OF METALLIC PATTERN AND METALLIC PATTERN

(75) Inventors: Satoshi Mori, Hachioji (JP); Shinichi Suzuki, Saitama (JP)

(73) Assignee: Konica Minolta IJ Technologies, Inc. (JP)

( * ) Notice: Subject to any disclaimer, the term of this patent is extended or adjusted under 35 U.S.C. 154(b) by 613 days.

(21) Appl. No.: 12/625,981

(22) Filed: Nov. 25, 2009

(65) Prior Publication Data

US 2010/0227078 A1 Sep. 9, 2010

(30) Foreign Application Priority Data

Mar. 3, 2009 (JP) ................. 2009-049072

(51) Int. Cl.
*B05D 3/10* (2006.01)
*B05D 1/18* (2006.01)

(52) U.S. Cl.
USPC ........................................ 427/304; 427/443.1

(58) Field of Classification Search ................ 427/97.9, 427/99.5, 98.1, 304, 305, 306, 437, 443.1
See application file for complete search history.

(56) References Cited

U.S. PATENT DOCUMENTS 7,255,782 B2 * 8/2007 Crouse .......................... 205/163
2005/0006339 A1 * 1/2005 Mardilovich et al. ........... 216/39

FOREIGN PATENT DOCUMENTS

| JP | 60024380 A | * | 2/1985 |
| JP | 7-131135 A | | 5/1995 |
| JP | 2002-299833 A | | 10/2002 |
| JP | 2005146372 A | * | 6/2005 |
| JP | 2007-42683 A | | 2/2007 |
| WO | 2009/150936 A1 | | 12/2009 |

OTHER PUBLICATIONS

European Search Report for Application No. 09176833.3-1232 dated Jul. 6, 2010.

* cited by examiner

*Primary Examiner* — Dah-Wei Yuan
*Assistant Examiner* — Nga Leung V Law
(74) *Attorney, Agent, or Firm* — Cantor Colburn LLP

(57) ABSTRACT

A method for forming a metallic pattern, which is provided with a printing process to print a pattern portion on a substrate by means of an inkjet method utilizing ink containing a precursor of a nonelectric plating catalyst and a plating process to form a metallic pattern by nonelectric plating on said pattern portion, wherein the surface of said substrate is constituted of ink non-absorptive resin and has been subjected to a plasma treatment, and said ink has a pH value at 25° C. of not less than 9.0.

12 Claims, No Drawings

FORMING METHOD OF METALLIC PATTERN AND METALLIC PATTERN

FIELD OF THE INVENTION

The present invention relates to a method for forming metallic pattern utilized for such as a circuit and an electrode, and particularly relates to method for forming a metallic pattern utilizing an inkjet method.

BACKGROUND OF THE INVENTION

Formation of a metallic pattern utilized for such as a circuit has been conventionally performed by a method utilizing a resist material.

That is, after a resist material is coated on a metallic foil layer, unnecessary resist being removed by a development after light exposure of a required pattern, metallic foil exposed being removed by etching, and further the remaining resist portion is peeled off, whereby metallic foil on which a metallic pattern has been recorded is formed.

However, in this method, because the process is manifold and consumes plenty of time, and there are many useless points with respect to manufacturing time and utilization efficiency of energy and starting materials such as due to removal of unnecessary resist and metallic foil, improvement has been required.

In recent years, noticed has been a method for forming a metallic pattern, such as described in JP-A 2002-299833 (hereinafter, JP-A refers to Japanese Patent Publication Open to Public Inspection No.), in which ink containing so-called metallic nano-particles is utilized and a metallic pattern is directly drawn by means of such as screen printing or inkjet printing.

This metallic pattern forming method is a method to form a circuit by sintering metallic nano-particles at approximately 200-300° C., utilizing that the melting point of metallic nano-particles is lowered by minimizing the particle size thereof.

This technology, although surely has an advantage of such as decreased processing steps and improvement of utilization efficiency of starting materials, there is remained a problem that complete fusing of metallic particles together was difficult and there were severe limitations of temperature and conditions in the post treatment to reduce the electric resistance of a metallic pattern after sintering.

Further, known is a method in which metal salt, without utilizing metallic nano-particles, is utilized to make a metal ion form in ink and a conductive pattern is formed from a solution containing a reducing agent having reducing power under heating.

However, there was a problem that, because ability of a complexing agent, which coordinates to metal salt and stabilizes said metal salt, was insufficient, a reducing reaction of metal salt easily proceeded resulting in poor storage stability of a solution.

On the other hand, proposed is a method in which a metallic pattern is formed utilizing nonelectric plating technology as a means to generate and precipitate metal under a mild condition.

For example, as described in JP-A 7-131135, known is a method in which a metallic pattern is formed by nonelectric plating after forming a circuit pattern by an inkjet method utilizing ink containing a catalyst which enables nonelectric plating.

Further, known is a method, in which a nonelectlic plating catalyst is adsorbed on the surface of a support, on which hydrophilic graft polymer chains are present, by means of such as an inkjet method and said surface is subjected to nonelectric plating, whereby a conductive pattern excellent in resolution, conductivity and durability is prepared (JP-A 2007-42683).

Further, as ink utilized in the above-described inkjet method, for example, ink containing palladium metal salt as a precursor of a nonelectric plating catalyst is utilized. This ink is printed to form a pattern, which is further subjected to nonelectric plating, whereby a metallic pattern is formed.

However, even in these methods, there were problems that reproducibility of fine lines is insufficient, adhesion between a metallic pattern and a substrate may be insufficient, and production efficiency is not satisfactory because an additional layer should be provided on a support.

SUMMARY OF THE INVENTION

This invention has been made in view of the above-described problems and an object is to provide a method for easy formation of a metallic pattern having excellent adhesion between a substrate and a metallic pattern as well as being excellent in fine line reproducibility and conductivity, and a metallic pattern prepared by said method.

The object of the present invention is achieved by the following means.

1. A method for forming a metallic pattern, which is provided with a printing process to print a pattern portion on a substrate by means of an inkjet method utilizing ink containing a precursor of a nonelectric plating catalyst and a plating process to form a metallic pattern by nonelectric plating on said pattern portion, wherein the surface of said substrate is constituted of ink non-absorptive resin and has been subjected to a plasma treatment, the precursor of a nonelectric plating catalyst is present in a state of being dissolved in ink, and said ink has a pH value at 25° C. of not less than 9.0.

2. The method of item 1, wherein the precursor of a nonelectric plating catalyst includes a palladium metal salt or a palladium ion.

3. The method of in item 2, wherein the ink contains a compound capable of forming a complex with the palladium metal salt or palladium ion.

4. The method of any one of items 1-3, wherein pH at 25° C. of the ink is not less than 12.5 and not more than 14.0.

5. The method of any one of items 1-4, wherein the substrate has been subjected to a plasma treatment under an atmosphere containing oxygen or ozone.

6. The method of any one of items 1-5, wherein the surface of the substrate is subjected to a plasma treatment so as to make the sum of a polar component and a hydrogen bond component thereon of not less than 5 mN/m and not more than 30 mN/m.

7. The method of any one of items 1-6, wherein a catalyst activating process to reduce a precursor of a nonelectric plating catalyst on said pattern portion is provided between the printing process and plating process.

8. A metallic pattern being prepared by the metallic pattern forming method of any one of items 1-7.

DETAIL DESCRIPTION

In the following, an embodiment to practice this invention will be detailed.

This invention provides one embodiment which is a method for forming a metallic pattern, which is provided with a printing process to print a pattern on a substrate by an inkjet method utilizing ink containing a precursor of a nonelectric plating catalyst and a plating process to form a metallic pattern on said pattern by nonelectric plating, wherein the surface of said substrate is constituted of ink non-absorptive resin and has been subjected to a plasma treatment, the precursor of a nonelectric plating catalyst is present in a state of being dissolved in ink and said ink has pH at 25° C. of not less than 9.0.

The embodiment of the invention can easily provide a metallic pattern having further excellent adhesion of substrate with a metallic pattern and excellent fine line reproducibility, particularly by designing the surface of a substrate as above-described and setting the pH of ink containing a precursor of a nonelectric plating catalyst to not less than 12.5 and not more than 14.0.

Further, a metallic pattern having more excellent fine line reproducibility can be easily prepared by providing the surface of the substrate with a plasma treatment under a condition so as to make the sum of a polar component and a hydrogen bond component among the components of the surface free energy thereof not less than 5 mN/m and not more than 30 mN/m.

<Ink>

Ink according to this invention contains a precursor of a nonelectric plating catalyst.

(Precursor of Nonelectric Plating Catalyst)

A precursor of a nonelectric plating catalyst according to this invention can be a trigger for nonelectric plating, which will be described later, and specifically includes palladium metal salt or palladium ion.

Palladium metal salt includes such as palladium fluoride, palladium chloride, palladium bromide, palladium iodide, palladium nitrate, palladium sulfate, palladium acetate, palladium acetoacetate, palladium trifluoroacetate, palladium hydroxide, palladium oxide and palladium sulfide.

Among them, palladium chloride is preferable.

As the presence state of a precursor of a nonelectric plating catalyst in ink, a dissolved state not a state of metal particles nor metal salt colloid (such as palladium-tin colloid) is preferable with respect to prevention of clogging of an inkjet head and easy formation of an electrostatic bonding with a functional group formed on the substrate surface by surface modification.

The content of a precursor of a nonelectric plating catalyst in ink is preferably 0.01-5.0 weight % and specifically preferably 0.01-1.0 weight % based on ink, with respect to reaction reactivity of nonelectric plating and stability of a precursor of a nonelectric plating catalyst in ink.

[pH]

Ink according to this invention is necessarily to have a pH value at 25° C. of not less than 9.0 and more preferably not less than 12.5 and not more than 14.0.

Adhesion between a substrate and a metallic pattern is improved by setting the pH of ink to not less than 12.5. By setting the pH of ink to not less than 12.5, due to a mechanism similar to an alkaline surface treatment from landing of ink on a substrate till drying of ink, that is, due to new formation of functional groups (such as a carboxyl group or a hydroxyl group) as a result of modification of the resin on the substrate surface by such as hydrolysis, bonding by electrostatic power is formed between said functional groups and palladium metal salt to further strengthen adhesion only at the patterned portion.

In the case that a precursor of a nonelectric plating catalyst contains palladium metal salt or palladium ion, the pH value of ink is specifically preferably from 12.5 to 14.0 also with respect to solubility of palladium metal salt and reducing power into palladium metal which will be described later.

To make the pH value of not less than 9.0, it is possible by such as addition of an alkaline agent into ink.

An alkaline agent includes inorganic alkaline agents such as hydroxide or salt of alkali metal such as sodium, potassium and lithium; and organic alkaline agents such as tetraalkyl ammonium, triethanolamine, diethanolamine and ethanolamine.

Among them, sodium hydroxide and potassium hydroxide are preferably utilized.

[Compound Capable of Forming Complex]

Ink according to this invention preferably further contains a compound capable of forming a complex with palladium metal salt or palladium ion, with respect to injection stability of ink.

A compound capable of forming a complex with palladium metal salt or palladium ion includes an organic acid having a carboxylic group such as oxalic acid, malonic acid, succinic acid, adipic acid, maleic acid, tartaric acid and garlic acid. And it is preferably an amine type compound or a nitrogen-containing heterocyclic compound. An amine type compound is a compound in which at least one of the hydrogen atoms of ammonia is substituted by hydrocarbon residual group R, and becomes a complexing agent for palladium ion. Herein, it also includes ammonia. Amine has a non-covalent electron pair on N atom and easily forms a complex with palladium ion. Amine includes straight chain amine compounds such as ammonia, methylamine, dimethylamine, trimethylamine, ethylamine, diethylamine, triethylamine, propylamine, dipropylamine, tripropylamine, butylamine, dibutylamine, tributylamine, pyridine, 2-aminopyridine, 3-aminopyridine, 4-aminopyridine, ethylenediamine, ethanolamine, triethanolamine and ethylenediamine tetraacetate; and cyclic amine compounds such as benzylamine. Nitrogen-containing heterocyclic compounds include such as pyridine, bipyridine and phenanthroline.

The content ratio of palladium metal salt or palladium ion against a compound capable of forming a complex with palladium metal salt or palladium ion is preferably in a range of 1/0.5-1/10 based on a mole ratio with respect to plating efficiency.

By making the mole ratio of the above-described range, the ratio of a complex formed by palladium metal salt or palladium ion with a compound capable of forming a complex with palladium metal salt or palladium ion is increased to make better solubility and reducing power of palladium metal salt in ink, which contributes to plating efficiency.

[Ink Solvent]

Ink according to this invention contains a solvent. An applicable solvent is preferably water and water-based liquid medium containing water with respect to solubility of the above-described palladium metal salt or palladium ion and a compound capable of forming a complex.

A water-based medium preferably contains water and a water-based organic solvent.

Examples of a water-soluble organic solvent includes alcohols (such as methanol, ethanol, propanol, isopropanol, butanol, isobutanol, secondary butanol and tertiary butanol), polyhydric alcohols (such as ethylene glycol, diethylene glycol, triethylene glycol, polyethylene glycol, propylene glycol, dipropylene glycol, polypropylene glycol, butylenes glycol, hexanediol, pentanediol, glycerin, hexanetriol and thioglycol), polyhydric alcohol ethers (such as ethylene glycol monomethylether, ethylene glycol monoethylether, ethylene glycol monobutylether, diethylene glycol monomethylether, diethylene glycol monoethylether, diethylene glycol monobutylether, propylene glycol monomethylether, propylene glycol monobutylether, ethylene glycol monomethylether acetate, triethylene glycol monomethylether, triethylene glycol monoethylether, triethylene glycol monobutylether, ethylene glycol monophenylether and propylene glycol monophenylether), amines (such as ethanolamine, diethanolamine, triethanolamine, N-methyldiethanolamine, N-ethyldiethanolamine, morpholine, N-ethylmolpholine, ethylenediamine, diethylenediamine, triethylenetetramine, tetraethylnepentamine, polyethyleneimine, pentamethyldiethylenetriaminea and tetramethypropylenediamine), amides (such as formamide, N,N-dimethylformamide and N,N-dimethylacetoamide), heterocycles (such as 2-pyrrolidone, N-methyl-2-pyrrolidone, cyclohexyl pyrrolidone, 2-oxazolidone and 1,3-dimethyl-2-imidazolidinone) and sulfoxides (such as dimethylsulfoxide).

A simple catalyst aqueous solution the solvent of which is comprised of only water may be unsuitable for inkjet ink. By incorporating the above-described organic solvent for such a case, it is possible to provide a suitable viscous property (viscosity) to adjust the viscosity into a range of 1.5-30 mPa/s for stable ejection of ink through an inkjet head. Further, it is also important to provide ink with a moisture keeping property to avoid solidification or ejection failure in a head nozzle due to evaporation of water content of ink and to adjust the surface tension of ink to 50-25 mN/m which is suitable for inkjet with an organic solvent. For these purposes, the above-described organic solvent is preferably contained at 5-90 weight % and more preferably 30-80 weight % in ink. Further, the boiling point of an organic solvent is preferably not lower than 80° C. and not higher than 250° C. with respect to a moisture keeping property and a drying property.

[Surfactant]

Ink according to this invention may contain a surfactant.

Surfactants include anionic surfactants such as alkylsulfate, alkylester sulfate, dialkylsulfosuccinates, alkylnaphthalene sulfonates, alkyl phosphate, polyoxyalkylenealkylether phosphate and fatty acid salts; nonionic surfactants such as polyoxyethylene alkylethers, polyoxyalkylene alkylphenylethers, acetylene glycols and polyoxyethylene-polyoxypropylene block copolymers; surfactants such as glycerin ester, sorbitane ester, polyoxyethylene fatty acid amide and amineoxide; cationic surfactants such as alkylamine salts and quaternary ammonium salts; fluorine type surfactants and silicone type surfactants.

[Other Various Additives]

Ink according to this invention can appropriately contain other additives well known in the art.

For example, listed are such as a fluorescent whitening agent, a defoaming agent, a lubricant, an anticeptic agent, a viscosity increasing agent, an antistatic agent, a matting agent, water-soluble polyvalent metal salt, acid, base, a pH controlling agent such as a buffer solution, an antioxidant, a surface tension controlling agent, a specific resistance controlling agent, an anti-stain agent and an inorganic pigment.

[Substrate]

A substrate according to this invention is a substrate the surface of which is constituted of ink non-absorptive resin and has been subjected to a plasma treatment.

An ink non-absorptive property refers to that there is no or practically no dissolution or swelling when being brought in contact with ink.

A substrate having been subjected to a plasma treatment is a substrate the above-described ink non-absorptive resin constituting the surface of which has been subjected to a plasma treatment.

Ink non-absorptive resin includes resins such as PET (polyethylene terephthalate), polyimide, polyethylene, polypropylene, polystyrene, ABS, methylmethacrylate, polyamide, polyacetal, polycarbonate, polybutylene terephthalate, polyphenylene sulfide, liquid crystal polymer, polyetherimide and polyethylene naphthalate.

In this invention, among them, polyimide and PET are preferable and polyimide is more preferably utilized.

A substrate according to this invention includes a substrate of a plate form or a film form provided with resin as described above on other substrate, or a substrate of a plate form or a film form constituted of resin such as described above, however, the latter is preferably utilized.

<Plasma Treatment>

A plasma treatment according to this invention is a treatment to make a gas having been made into a plasma state bring in contact with the subject to be treated.

A specific condition of a plasma treatment includes, for example, a treatment in which low temperature plasma of an inorganic gas is generated and brought in contact with the substrate surface by applying direct current or alternate current between the electrodes to generate glow discharge while the inner pressure of the inside of an apparatus to perform a plasma treatment being kept at $0.11$-$1.1 \times 10^5$ Pa under an atmosphere of an inorganic gas.

Plasma generated, due to its very high energy, causes vigorous physical collision with the substrate surface and said surface is etched. As a result, an anchor effect is obtained due to increase of the surface area.

The processing time of a plasma treatment is preferably approximately 1-1,000 seconds.

Inorganic gas includes oxygen, hydrogen, carbon monoxide, carbon dioxide, ammonia, nitrogen, fluorine and air in addition to inert gas such as helium, neon and argon.

In this invention, oxygen or ozone which can make anionic functional groups present on the substrate surface is preferably utilized.

In the case of an anionic functional group, adhesion is improved due to electrostatic power generated between said group and a cationic ion of a precursor of a nonelectric plating catalyst in ink or palladium ion (cationic) as a preferable catalyst component.

A plasma treatment is preferably is a treatment to make the following surface free energy of a substrate with respect to a wetting property of ink.

It is a preferable treatment to make the sum of a polar component and a hydrogen bond component of not less than 0.1 mN/m, when the surface free energy is represented as the sum of three components; a dispersion component, a polar component and a hydrogen bond component.

Further, a specifically preferable treatment provides a condition in which the sum of a polar component and a hydrogen bond component of the surface free energy is not less than 5 mN/m and not more than 30 mN/m.

The surface free energy of the solid surface referred here can be represented as the sum of three kinds of components; $\gamma_s^d$ (dispersion component), $\gamma_s^p$ (polar component) and $\gamma_s^H$ (hydrogen bond component).

$$\gamma_s = \gamma_s^d + \gamma_s^P + \gamma_s^H$$

Further, the surface free energy of a solid is represented as follows according to Young-Fowkes equation.

$$\gamma_L + \gamma_L \cos\theta = 2\{(\gamma_s^d \gamma_L^d)^{1/2} + (\gamma_s^P \gamma_L^P)^{1/2} + (\gamma_s^H \gamma_L^H)\}$$

Employing these relationships, only a dispersion component among the surface free energy of a solid sample can be determined by placing a liquid, which is constituted of only a dispersion component, on a solid sample to measure the contact angle.

A polar component can be determined by measuring the contact angle of a liquid constituted of $\gamma^d$ and $\gamma^p$ on a solid a dispersion component of which has been determined.

In this manner, three components of the surface free energy of a solid can be determined in turn.

In this invention, a plasma treatment is preferably one in which the sum of said polar component and said hydrogen bond component is not less than 5 MN/m and not more than 30 mN/m, when the surface free energy of the aforesaid substrate is represented as the sum of three components; a dispersion component, a polar component and a hydrogen bond component.

It is possible to secure the amount of generated functional groups to improve adhesion when the sum of said polar component and said hydrogen bond component is not less than 5 mN/m. Further, excessive wetting between ink and a substrate is prevented resulting in excellent fine line reproducibility when said sum is not more than 30 MN/m.

In this invention, a metallic pattern having an excellent adhesion with a substrate can be prepared by forming a pattern portion of a catalyst utilizing a substrate the surface of which has been subjected to a plasma treatment and by use of ink having a specific pH.

The reason is estimated as follows.

Chemically active functional groups (such as a carboxyl group and a hydroxyl group) are generated on the surface of resin by performing a plasma treatment.

A precursor of a nonelectric plating catalyst is provided with metal and is present in an ion state in ink. That is, in the case that a precursor of a nonelectric plating catalyst is provided with palladium, said palladium is present in a state of palladium ion ($Pd^{2+}$).

In a state of ink according to this invention being printed on resin of a substrate, since ink is alkaline, functional groups (such as a carboxyl group or a hydroxyl group) are newly formed on the surface portion of resin, and ink very slightly penetrates into this modified layer to form a layer in which a precursor of a nonelectric plating catalyst is present. In the following, explanation will be made about the case of a precursor of a nonelectric plating catalyst containing palladium.

It is estimated that the surface area of resin increases due to an etching effect by a plasma treatment to generate a physical anchor effect between palladium ion and a substrate, whereby the adhesion is improved. Further, it is estimated that adhesion is further strengthened in accordance with an effect of electrostatic bonding between functional groups formed by a plasma treatment or functional groups having been newly increased due to contact with highly alkaline ink and palladium ion.

Further, inventors of this invention have found that, at the time of forming a metallic pattern, the layer thickness of a formed metallic pattern becomes more uniform owing to a combination of a plasma treatment and alkaline ink.

Generally, it is known that a so-called cohering phenomenon, in which the solid content contained in a liquid drop accumulates on the outer surroundings of the liquid drop in accordance with drying, is observed in the case of liquid drops are patterned on a non-absorptive substrate.

It is not an exception in the case of ink containing a precursor of a nonelectric plating catalyst of this invention, and there was a tendency that palladium ions accumulate on the outer surroundings of a liquid drop in accordance with evaporation of a solvent, when ink containing palladium ion was patterned on a substrate without a treatment. As a result, there was observed a phenomenon of unevenness of the layer thickness after formation of a metallic pattern because of uneven cohering-wise distribution of palladium ion.

On the other hand, in the case of a substrate being provided with a plasma treatment, fine roughness is formed on the substrate surface due to an etching effect. It has been proved that, in a drying process of a solvent, cohering-wise accumulation of palladium ions is decreased owing to proceeding of drying with adsorption of palladium ions on the roughness portion of a substrate, as a result uneven thickness of a metallic pattern to be formed is also decreased.

Further, it has been proved that distribution uniformity of palladium ions on a substrate having been subjected a plasma treatment becomes more remarkable by very little immersion of palladium ions together with ink at the time of forming a modified layer on the substrate surface due to contact with highly alkaline ink.

<Method for Forming Metallic Pattern>

(Printing Process)

In a method for forming a metallic pattern of this invention, ink containing a precursor of a nonelectric plating catalyst is ejected from an inkjet head on a substrate, whereby a pattern portion is formed on the substrate.

The pattern portion refers to a portion where ink is present on a substrate.

The size of a liquid drop ejected is not specifically limited, however, is set to a liquid drop quantity of not more than 50 pl and preferably not more than 20 pl because formation of fine lines is required in the case of such as a circuit wiring.

An inkjet head is not specifically limited, and either of a piezo type head or a thermal type head can be utilized.

(Catalyst Activation Process)

In a method for forming a metallic pattern of this invention, a catalyst activation process is preferably provided between the printing process and a plating process to perform nonelectric plating which will be described later.

That is, after the ink containing a precursor of a nonelectric catalyst in a dissolved state has been printed on a substrate, metal ions such as palladium ions ($Pd^{2+}$) are made to be 0-valent metal)($Pd^0$) by providing a catalyst activation treatment before a plating process to perform nonelectric plating, whereby a precursor of a catalyst is made to work as a catalyst to make the nonelectric plating reaction more active.

In this invention, a process to make metal of a catalyst precursor, specifically palladium metal, to be 0-valent is referred to as a catalyst activation process.

A treatment performed in a catalyst activation process includes such as application of an acid, heating and application of a reducing agent; however, application of a reducing agent is preferably employed.

As a reducing agent, a boron type compound is preferable and specifically such as sodium boron hydride, trimethylamine borane and dimethylamine borane (DMAB) are preferable.

That is, these reducing agents are preferably supplied at the printing portion as a form of a reducing agent solution.

(Nonelectric Plating)

Nonelectric plating according to this invention will be explained.

A metallic pattern can be prepared by immersing a substrate into a nonelectric plating solution (bath) after the aforesaid printing process or catalyst activation process.

In a nonelectric plating solution, 1) metal ion, 2) complexing agent and 3) reducing agent are primarily contained.

Metal formed by nonelectric plating includes such as gold, silver, palladium, nickel and alloys thereof, however, is preferably silver or copper and more preferably copper, with respect to conductivity and safety.

Therefore, as a metal ion utilized in a nonelectric plating bath, a metal ion corresponding to the above-described metal is preferably incorporated, and for example, a nonelectric plating bath preferably contains copper sulfate.

Further, a complexing agent and a reducing agent suitable for the above-described metal ion are selected and incorporated in a nonelectric plating bath.

A complexing agent includes such as ethylenediamine tetraacetate (hereinafter, abbreviated as EDTA), Rochelle salt, D-manitol, D-sorbitol, dulcitol, imino diacetate and trans-1, 2-cyclohexanediamine tetraacetate, and EDTA is preferred.

A reducing agent includes such as formaldehyde, potassium tetrahydroborate, dimethylamine borane, glyoxylic acid and sodium hydrophosphite, and formaldehyde is preferable.

In the above-described nonelectric plating process, the rate or film thickness of metal formation can be controlled by adjusting temperature of a plating bath, pH, immersing time and metal ion concentration.

The thickness of metallic film in this invention is preferably not less than 0.01 μm and not more than 30 μm.

EXAMPLES

In the following, this invention will be concretely explained in reference to examples, however, is not limited thereto. Herein, an expression of "part(s)" or "%" in the examples represents "weight part(s)" or "weight %" unless otherwise mentioned.

<Preparation of Ink>
[Preparation of Ink 1, Ink 2, Ink 3, Ink 4 and Ink 5]

Ink, comprising 0.2 weight % of palladium chloride as a precursor of a catalyst, 0.2 weight % of 2-aminopyridine as a complexing agent, 30 weight % of ethylene glycol as a water-soluble organic solvent, 10 weight % of glycerin and the residual portion of water, was prepared.

The pH of ink was adjusted to 14.0 with sodium hydroxide, whereby ink 1 was prepared.

In a similar manner, inks were adjusted by use of sodium hydroxide and hydrochloric acid to make the pH of ink of 12.6, 11.0, 9.0 and 6.8, which were defined as ink 2, ink 3, ink 4 and ink 5.

[Preparation of Ink 6]

Ink 6 was prepared in a similar manner to ink 1 except that 2-aminopyridine as a complexing agent was omitted.

[Preparation of Ink 7: Comparative Example]

Ink was prepared by dissolving 0.1 weights of palladium nitrate as a precursor of a catalyst, 30 weight % of ethylene glycol and 10 weight % of glycerin in water. The pH was adjusted to 7.0 to prepare ink 7 (Palladium nitrate was confirmed to be dissolved).

[Substrate]

Substrates shown in table 1 (a polyimide sheet and a PET sheet having a thickness of 75 μm) were utilized.

[Plasma Treatment]

The above-described substrate sheets were subjected to a plasma treatment under an oxygen atmosphere, at a frequency of 10 MHz and a direct current voltage of 300V. The irradiation condition was varied according to electric power (W) and processing time (sec) shown in table 1.

[Graft-Polymerization Treatment: Comparative Example]

The above-described substrate having been subjected to a plasma treatment was immersed in a 10 weight % sodium styrenesulfonate aqueous solution with nitrogen bubbling at 70° C. for 7 hours. The film having been immersed was washed with water for 8 hours, whereby a substrate the surface of which is graft-polymerized with sodium styrenesulfonate was prepared.

[Measurement of Surface Free Energy]

The surface free energy of the above-described substrates having been subjected to a plasma treatment and to a graft-polymerization treatment was determined as follows.

The contact angle of a liquid, three components of surface energy ($\gamma_D$: dispersion component, $\gamma_p$: polar component, $\gamma_H$: hydrogen bond component) of which are known, was measured and the surface free energy of the sample was calculated by use of Young-Fowkes equation.

In this example, contact angles were measured utilizing three solvents of propylene carbonate, water and n-nonane, and the surface energy of each three component of surface free energy of a substrate was calculated, whereby the sum of a polar component ($\gamma_p$) and a hydrogen bond component ($\gamma_H$) was determined.

<Formation of Metallic (Wiring) Pattern>
[Formation of Metallic (Wiring) Pattern 1]
(Printing of Pattern Portion)

Aqueous Type Inkjet Head KM256AQ (manufactured by Konicaminolta IJ Co., Ltd.) was mounted on Inkjet Head Tester EB100 (manufactured by Konicaminolta IJ Co., Ltd.) which was equipped on Conveyer System Option XY100, whereby the above-described inks were ready for ejection.

The above-described substrate was equipped on a stage and ink was ejected to print 100 lines of fine line patterns having a wiring width of 50 μm, a distance between wirings of 50 μm and a wiring length of 30 mm, and a square pattern of 10 mm×10 mm.

(Catalyst Activation Process)

The substrate, after having been provided with a pattern portion according to the above-described method, was dried at 80° C. for 5 minutes and then immersed into the following activation solution containing a reducing agent of a boron type at room temperature for 15 minutes.

In this process, a palladium complex was reduced to form palladium metal. Substrate 1, after having been immersed, was washed with pure water.

| | |
|---|---|
| Alcup MRD-2-A (manufactured by C. Uyemura & Co., Ltd.) | 1.8 weight % |
| Alcup MRD-2-C (manufactured by Uyemura & Co., Ltd.) | 6 weight % |
| Pure water | the rest |

(Plating Process)

The nonelectric copper plating solution described below was prepared. The finished plating solution was comprised of a copper concentration of 2.5 weight, a formalin concentration of 1 weight % and an ethylenediamine tetraacetate (EDTA) concentration of 2.5 weight %. Further, the pH of the plating solution was adjusted to 13.0 with sodium hydroxide.

| Nonelectric Plating solution | |
|---|---|
| Melplate CU-5100A (manufactured by Meltex Inc.) | 6 weight % |
| Melplate CU-5100B (manufactured by Meltex Inc.) | 5.5 weight % |
| Melplate CU-5100C (manufactured by Meltex Inc.) | 2.0 weight % |
| Melplate CU-5100M (manufactured by Meltex Inc.) | 4.0 weight % |
| Pure water | the rest |

A substrate having been subjected to a treatment of an activation process was immersed into the above-described nonelectric copper plating solution maintained at 50° C. for 90 minutes, whereby 100 lines of metallic wiring patterns having a wiring width of 50 μm, a distance between wirings of 50 μm and a wiring length of 30 mm, and a square metal pattern of 10 mm×10 mm, were formed.

<Evaluation of Metallic (Wiring) Pattern>

With respect to metallic patterns formed by use of the above-described ink, each evaluation described below was made.

(Evaluation of Reproducibility of Fine Lines)

The above-prepared each copper wiring pattern was observed through an optical microscope and reproducibility of fine lines was evaluated based on the following ranks.

A: No lacks (wire breaking) in fine lines and no contacts of fine lines each other are observed and disorder (thinning or thickening) of a line form is less than 2%.

B: No lacks (wire breaking) in fine lines and no contacts of fine lines each other are observed and disorder (thinning or thickening) of a line form is not less than 2% and less than 8%.

C: No lacks (wire breaking) in fine lines and no contacts of fine lines each other are observed and disorder (thinning or thickening) of a line form is not less than Fit and less than 15%.

D: No lacks (wire breaking) in fine lines and no contacts of fine lines each other are observed and disorder (thinning or thickening) of a line form is not less than 15% and less than 30%.

C: Lacks (wire breaking) in fine lines and contacts of fine lines each other are observed and disorder (thinning or thickening) of a line form is not less than 300.

[Evaluation of Adhesion]

A metallic patter having a size of 10 mm×10 mm was formed by the above-described metallic pattern forming method.

With respect to this pattern, evaluation of adhesion by a tape peeling test according to descriptions of JIS C5600 was made. Specifically, a cut of a 25-square grating pattern having an interval of 2 mm in length and breadth was formed by use of a cutter and cellophane tape was pasted up on this grating pattern. The number of pieces peeled off toward the tape at the time of peeling off of this tape was counted and the results were evaluated based on the following ranks to be an index of adhesion.

A: No metallic patterns peeled off are observed.

B: Some metallic patterns peeled off are observed; however, the generation number is less than 5%.

C: Some metallic patterns peeled off are observed; however, the generation number is not less than 5% and less than 9%.

D: Some metallic patterns peeled off are observed; however, the generation number is not less than 9% and less than 13%.

E: Some metallic patterns peeled off are observed and the generation number is not less than 13%.

[Evaluation of Conductivity]

Four-Stylus Prove PSP of Resistivity Meter Roresta GP (manufactured by Dia Instruments Co., Ltd.) was connected to each copper wiring pattern, the reproducibility of which had been evaluated above, to measure conductivity, and conductivity was evaluated according to the following ranks.

A: The conductivity is less than 5 μΩ·cm.

B: The conductivity is not less than 5 μΩ and less than 8 μΩ·cm.

C: The conductivity is not less than 8 μΩ and less than 15 μΩ·cm.

D: The conductivity is not less than 15 μΩ and less than 25 μΩ·cm.

E: The conductivity is not less than 25 μΩ·cm.

Herein, ranks not worse than C in any one of reproducibility of fine lines, adhesion and conductivity were evaluated to be in a range suitable for practical use. Each evaluation result obtained above will be shown in table 1.

TABLE 1

| Metallic wiring pattern No. | Substrate | Plasma treatment condition | | Surface free energy $\gamma^P + \gamma^H$ (mN/m) | Ink | | Evaluation results | | | Remarks |
|---|---|---|---|---|---|---|---|---|---|---|
| | | Electric power (W) | Processing time (sec) | | No. | pH | Reproducibility | Adhesion | Conductivity | |
| 1 | Polyimide | 50 | 60 | 25 | 1 | 14.0 | A | A | A | Inv. |
| 2 | Polyimide | 50 | 60 | 25 | 2 | 12.6 | A | A | B | Inv. |
| 3 | Polyimide | 50 | 60 | 25 | 3 | 11.0 | A | A | C | Inv. |
| 4 | Polyimide | 50 | 60 | 25 | 4 | 9.0 | B | B | C | Inv. |
| 5 | Polyimide | 50 | 60 | 25 | 5 | 6.8 | B | D | C | Comp. |
| 6 | Polyimide | 10 | 30 | 5 | 1 | 14.0 | B | B | B | Inv. |
| 7 | Polyimide | 10 | 30 | 5 | 2 | 12.6 | B | B | B | Inv. |
| 8 | Polyimide | 10 | 30 | 5 | 3 | 11.0 | B | B | C | Inv. |
| 9 | Polyimide | 10 | 30 | 5 | 4 | 9.0 | B | B | C | Inv. |
| 10 | Polyimide | 10 | 30 | 5 | 5 | 6.8 | C | E | D | Comp. |
| 11 | Polyimide | 10 | 5 | 3 | 1 | 14.0 | B | C | B | Inv. |
| 12 | Polyimide | 10 | 5 | 3 | 2 | 12.6 | B | C | C | Inv. |
| 13 | Polyimide | 10 | 5 | 3 | 3 | 11.0 | B | C | C | Inv. |
| 14 | Polyimide | 10 | 5 | 3 | 4 | 9.0 | C | C | C | Inv. |
| 15 | Polyimide | 10 | 5 | 3 | 5 | 6.8 | D | E | E | Comp. |
| 16 | Polyimide | 100 | 60 | 35 | 1 | 14.0 | B | C | B | Inv. |
| 17 | Polyimide | 100 | 60 | 35 | 2 | 12.6 | B | C | C | Inv. |
| 18 | Polyimide | 100 | 60 | 35 | 3 | 11.0 | B | C | C | Inv. |
| 19 | Polyimide | 100 | 60 | 35 | 4 | 9.0 | C | C | C | Inv. |
| 20 | Polyimide | 100 | 60 | 35 | 5 | 6.8 | D | E | D | Comp. |
| 21 | Polyimide | None | None | 0 | 1 | 14.0 | D | E | C | Comp. |
| 22 | Polyimide | None | None | 0 | 2 | 12.6 | D | E | D | Comp. |
| 23 | Polyimide | None | None | 0 | 3 | 11.0 | D | E | D | Comp. |
| 24 | Polyimide | None | None | 0 | 4 | 9.0 | D | E | E | Comp. |
| 25 | Polyimide | None | None | 0 | 5 | 6.8 | E | E | E | Comp. |
| 26 | Polyimide | 50 | 60 | 25 | 6 | 14.0 | B | B | C | Inv. |
| 27 | PET | 150 | 180 | 15 | 2 | 12.6 | B | B | B | Inv. |
| 28 | Polyimide | 50 | 60 | 40 | 7 | 7.0 | D | A | D | Comp. |

Inv.: This invention, Comp.: Comparative example

It is clear from table 1 that, among substrates having been subjected to a plasma treatment, only methods of this invention utilizing ink, which has the sum of polar component and a hydrogen bond component of the surface of not less than mN/m and not more than 30 mN/m and pH of not less than 12.5, easily provides a metallic pattern excellent in adhesion as well as excellent in fine line reproducibility and conductivity without accompanying process to provide an additional layer.

As is shown in examples, the examples of the present invention provided a method for forming a metallic pattern which provides a metallic conductive pattern excellent in adhesion between a substrate and the metallic pattern as well as excellent in fine line reproducibility and conductivity, and a metallic pattern prepared by the same.

What is claimed is:

1. A method for forming a metallic pattern by an inkjet method, comprising:
    a printing process to form a pattern portion on a substrate by jetting an ink containing a precursor of a nonelectric plating catalyst; and
    a plating process to form a metallic pattern by nonelectric plating on the pattern portion,
    wherein the surface of the substrate is constituted of ink non-absorptive resin and has been subjected to a plasma treatment so as to make the sum of a polar component and a hydrogen bond component thereon of the surface free energy of the substrate not less than 5 mN/m and not more than 30 mN/m, the precursor of the nonelectric plating catalyst is present in a state of being dissolved in ink, and the ink has a pH value at 25° C. of not less than 9.0; and wherein the printing process is done after the plasma treatment.

2. The method of claim 1, wherein the precursor of the nonelectric plating catalyst includes a palladium metal salt or a palladium ion.

3. The method of claim 2, wherein the ink contains a compound capable of forming a complex with the palladium metal salt or palladium ion.

4. The method of claim 3, wherein a pH value at 25° C. of the ink is not less than 12.5 and not more than 14.0.

5. The method of claim 4, further comprising a catalyst activating process to reduce the precursor of the nonelectric plating catalyst jetted on the pattern portion between the printing process and the plating process.

6. The method of claim 1, wherein a pH value at 25° C. of the ink is not less than 12.5 and not more than 14.0.

7. The method of claim 1, wherein the substrate has been subjected to a plasma treatment under an atmosphere containing oxygen or ozone.

8. The method of claim 1, further comprising a catalyst activating process to reduce the precursor of the nonelectric plating catalyst jetted on the pattern portion between the printing process and the plating process.

9. The method of claim 8, wherein the plating process comprises immersing the substrate into a nonelectric plating solution after the catalyst activation process.

10. The method of claim 1, wherein the substrate includes polyamide, polyethylene terephthalate or mixture thereof.

11. The method of claim 1, wherein the ink as a viscosity of 1.5 to 30 mPa/s.

12. The method of claim 1, wherein the ink comprises the precursor in an amount of 0.01 to 5.0 weight percent.

* * * * *